United States Patent
Dhayni

(10) Patent No.: US 11,403,502 B2
(45) Date of Patent: Aug. 2, 2022

(54) METHOD FOR MANAGING THE OPERATION OF AN OBJECT THAT IS ABLE TO CONTACTLESSLY COMMUNICATE WITH A READER

(71) Applicant: STMicroelectronics International N.V., Schiphol (NL)

(72) Inventor: Achraf Dhayni, Vallauris (FR)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 515 days.

(21) Appl. No.: 16/456,795

(22) Filed: Jun. 28, 2019

(65) Prior Publication Data
US 2019/0325283 A1    Oct. 24, 2019

Related U.S. Application Data

(62) Division of application No. 14/839,673, filed on Aug. 28, 2015, now Pat. No. 10,380,474.

(51) Int. Cl.
*G06K 19/07* (2006.01)
*G06K 7/00* (2006.01)
(Continued)

(52) U.S. Cl.
CPC ....... *G06K 19/0726* (2013.01); *G06K 7/0095* (2013.01); *G06K 19/073* (2013.01);
(Continued)

(58) Field of Classification Search
CPC ............. G06K 19/0726; G06K 7/0095; G06K 19/0722; G06K 19/073; H03C 1/08; H04B 5/0031; H04B 5/0075
(Continued)

(56) References Cited

U.S. PATENT DOCUMENTS

| 3,934,201 A | 1/1976 | Majefski |
| 2006/0238301 A1 | 10/2006 | Wu et al. |

(Continued)

FOREIGN PATENT DOCUMENTS

| EP | 1939787 | 7/2008 |
| EP | 2573952 | 3/2013 |
| FR | 2978890 | 2/2013 |

OTHER PUBLICATIONS

"Aligns the Kernel Identifier Tag and corrects the Contactless Protocol Parameter Profile Values and the Class byte for the Put Template, Get Template and Set Mode Commands," Specification Bulletin No. 94, First Edition Nov. 2011, pp. 1-4.

(Continued)

*Primary Examiner* — Thien M Le
*Assistant Examiner* — Tae W Kim
(74) *Attorney, Agent, or Firm* — Slater Matsil, LLP

(57) ABSTRACT

A device for managing operation of an object capable of contactless communication with a reader magnetically coupled to the object includes a modulator configured to modulate an impedance of a load connected across terminals of an antenna of the object during a transmission phase during which information is transmitted from the object to the reader. The device further includes a monitor configured to carry out a monitoring phase, prior to the transmission phase. The monitoring phase includes a test modulation of the impedance of the load, a monitoring of a level of amplitude modulation of a modulated test signal present at the antenna of the object and resulting from the test modulation, and a capacitive modification of the impedance of the load if this level is lower than a threshold.

20 Claims, 3 Drawing Sheets

(51) Int. Cl.
   *H04B 5/00*    (2006.01)
   *G06K 19/073*  (2006.01)
   *H03C 1/08*    (2006.01)

(52) U.S. Cl.
   CPC ........... *G06K 19/0722* (2013.01); *H03C 1/08* (2013.01); *H04B 5/0031* (2013.01); *H04B 5/0075* (2013.01)

(58) Field of Classification Search
   USPC ....................................................... 235/492
   See application file for complete search history.

(56) References Cited

U.S. PATENT DOCUMENTS

| | | | | |
|---|---|---|---|---|
| 2007/0143080 | A1* | 6/2007 | Yancey | H04L 25/4902 702/189 |
| 2007/0217498 | A1* | 9/2007 | Tenconi | G06K 7/0008 375/238 |
| 2007/0236336 | A1* | 10/2007 | Borcherding | H04B 5/0068 340/10.34 |
| 2008/0194200 | A1* | 8/2008 | Keen | G08B 13/2417 455/41.1 |
| 2012/0270499 | A1* | 10/2012 | Wilson | G06K 19/0723 455/41.1 |
| 2016/0092762 | A1 | 3/2016 | Dhayni | |

OTHER PUBLICATIONS

"EMV Contactless Specifications for Payment Systems," EMV Contactless Communication Protocol Specification, Version 2.0.1, Jul. 2009, 157 pages.

"EMV Contactless Specification for Payment Systems," Book B, Entry Point Specification, Version 2.1, Mar. 2011, 50 pages.

EMVCo,LLC, "EMV Contactless Specifications for Payment Systems," EMV Contactless Communication Protocol Specification, Version 2.0.1, Jul. 2009, 157 pages.

* cited by examiner

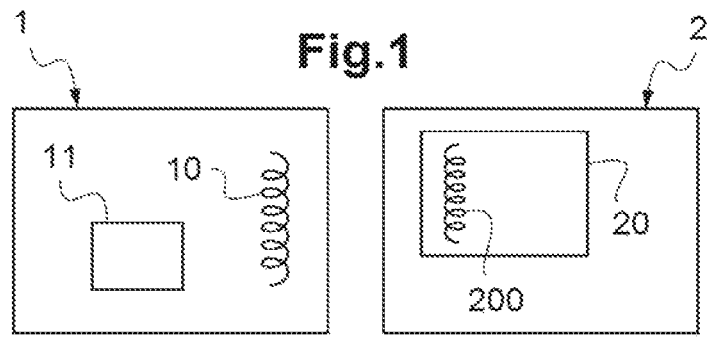
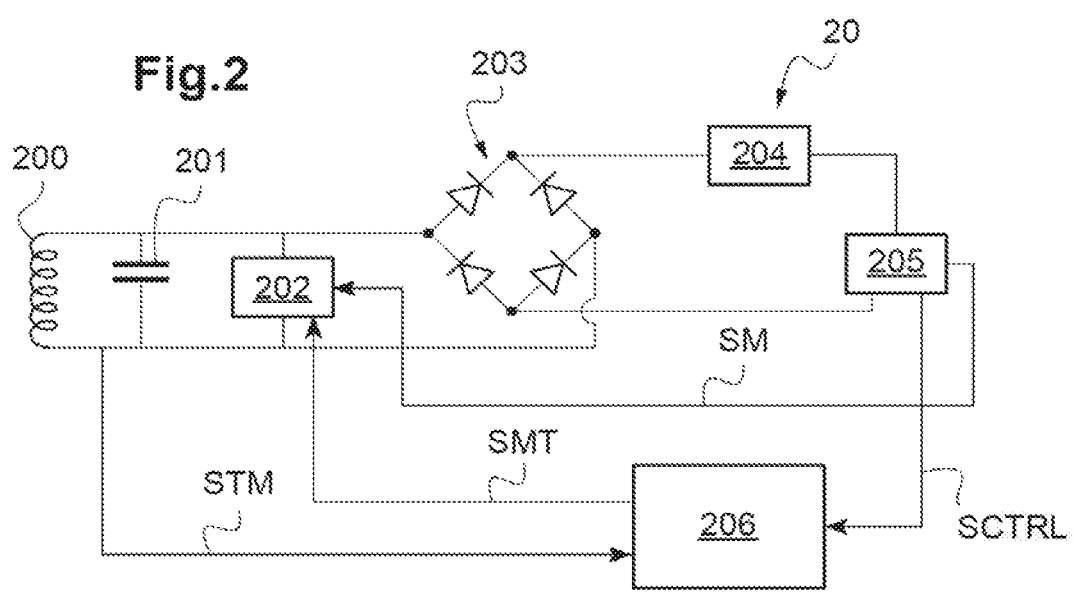
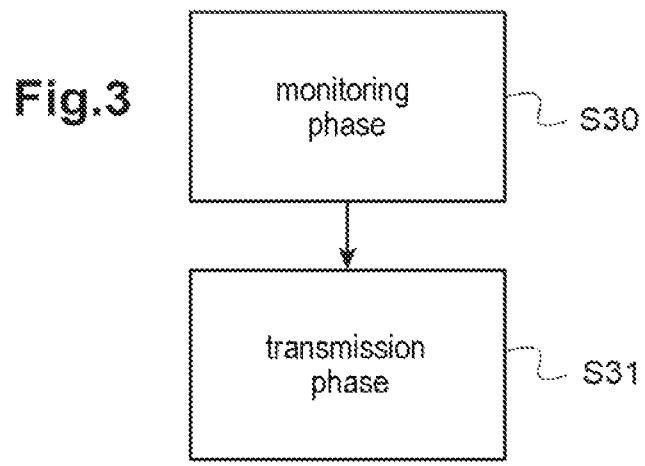

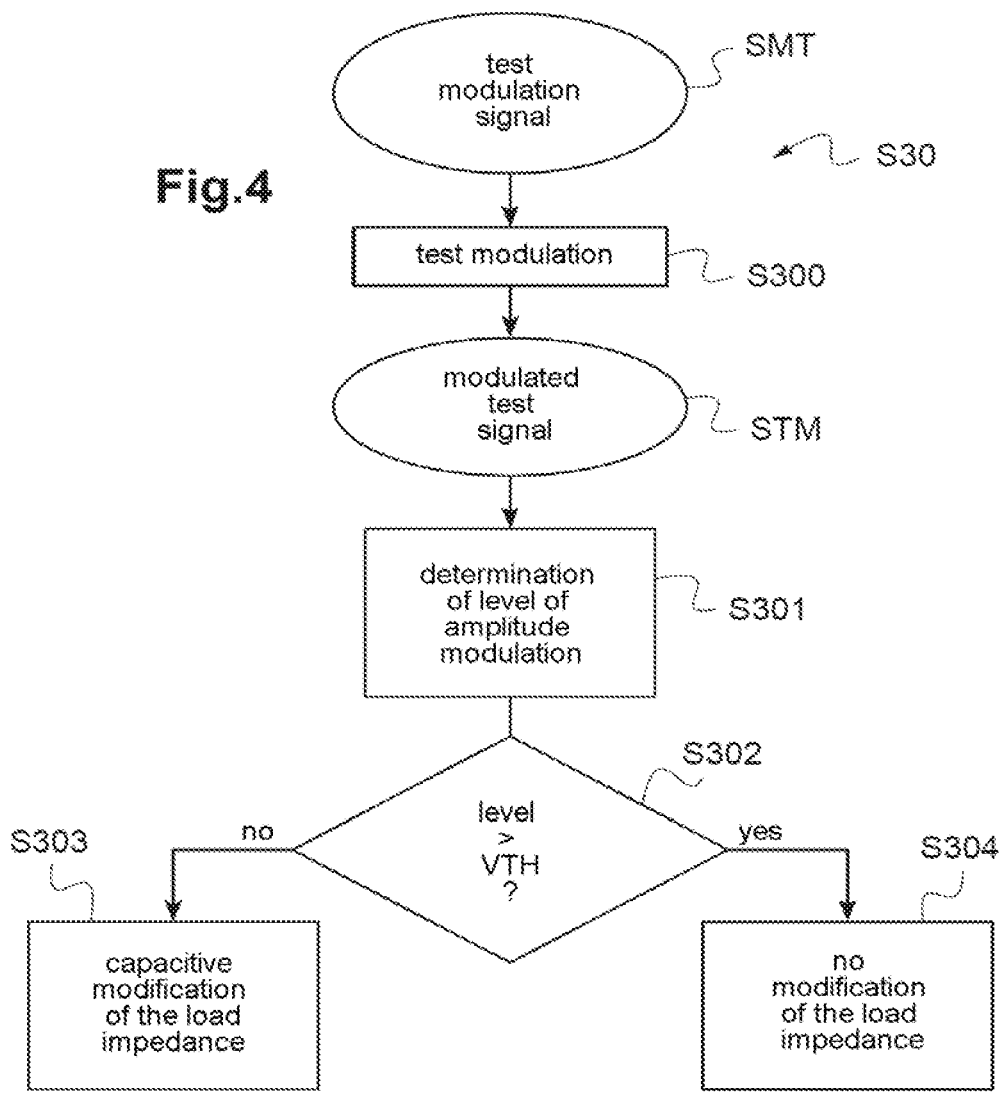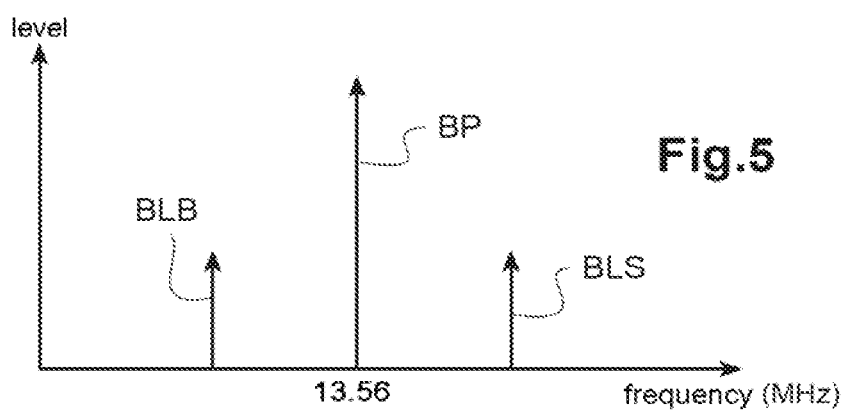

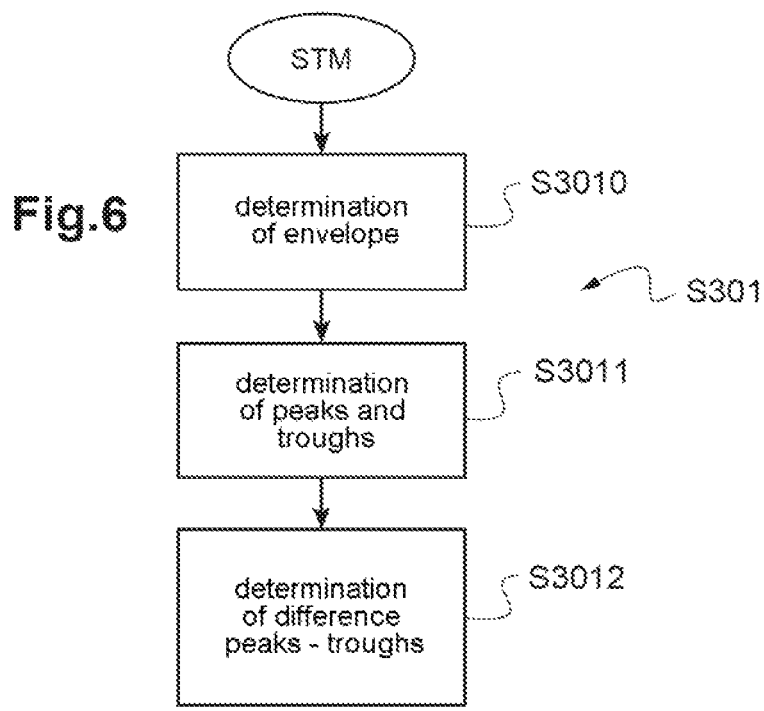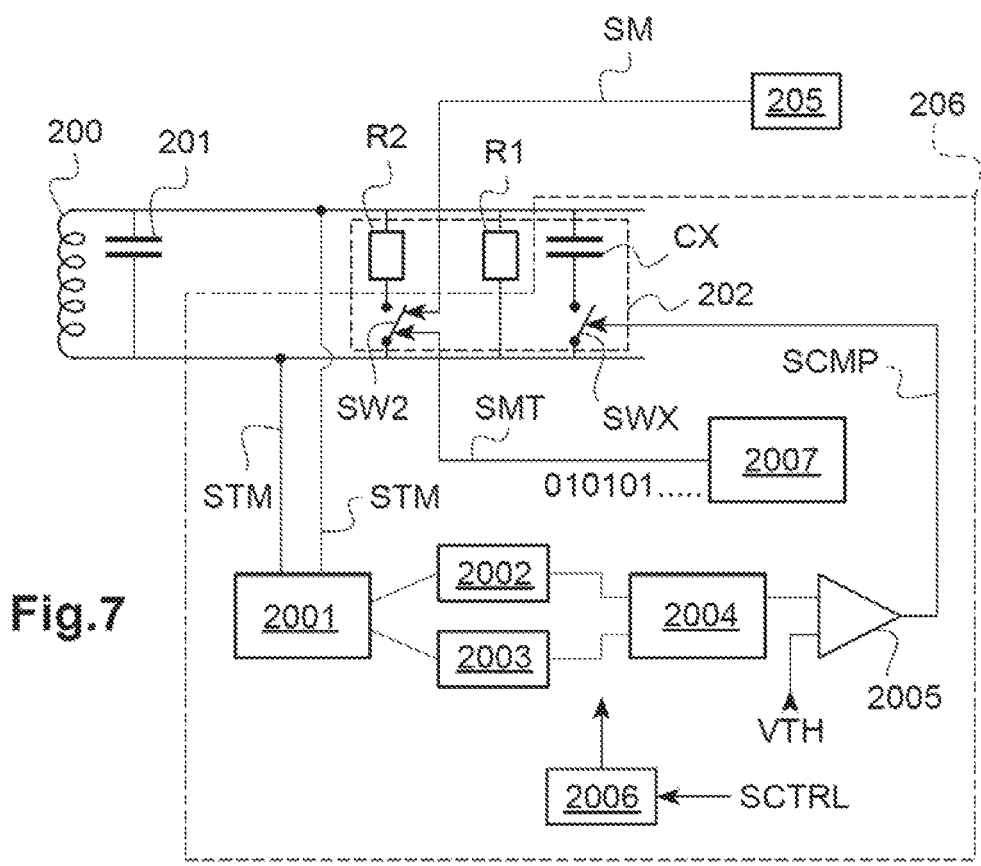

METHOD FOR MANAGING THE OPERATION OF AN OBJECT THAT IS ABLE TO CONTACTLESSLY COMMUNICATE WITH A READER

CROSS-REFERENCE TO RELATED APPLICATIONS

This application is a divisional of U.S. application Ser. No. 14/839,673 filed on Aug. 28, 2015, which claims the priority to French Application No. 1459169, filed on Sep. 29, 2014, which applications are hereby incorporated herein by reference.

TECHNICAL FIELD

Embodiments of the invention relate to a method for managing the operation of an object that is able to contactlessly communicate with a reader, as well as a corresponding device and object.

BACKGROUND

Near field communications is a wireless connectivity technology which allows a communication over a short distance, for example 10 cm, between electronic devices, such as for example contactless smartcards or mobile telephones emulated in card mode, and readers.

NFC technology is particularly well adapted for connecting any type of user device and enables quick and easy communications.

A contactless object is an object capable of exchanging information via an antenna with another contactless object, for example a reader, according to a contactless communications protocol.

An NFC object, which is a contactless object, is an object compatible with NFC technology.

NFC technology is an open technology platform standardized in the ISO/IEC 18092 standard and ISO/IEC 21481 standard but incorporates several previously-existing standards such as for example the type A and type B protocols defined in the ISO-14443 standard, which can be communications protocols usable in NFC technology.

Aside from its conventional function as a telephone, a cellular mobile telephone may be used (if it is equipped with specific means) for exchanging information with another contactless device, for example a contactless reader, using a contactless communications protocol usable in NFC technology.

This allows information to be exchanged between the contactless reader and secure elements situated within the mobile telephone. Numerous applications are thus possible such as mobile ticketing for public transport (the mobile telephone behaves as a travel ticket) or else mobile payment (the mobile telephone behaves as a payment card).

Furthermore, Europay Mastercard Visa, abbreviated by the acronym EMV, is an international security standard for payment cards of the smartcard type initiated by the EMVCo consortium. The majority, or even the entirety, of bank smartcards conform to the EMV standard as do the majority, or even all, of the electronic payment terminal installations. The various publications encompassing the specifications of the EMV standard, in particular version 2.3 of November 2011, are available from the EMVCo consortium.

Furthermore, specifications, entitled "EMV Contactless Specifications for Payment Systems" and, in version 2.1 of March 2011 available from the EMVCo consortium, comprising four volumes, notably relate to the contactless communications protocol used for carrying out bank transactions between two contactless devices, and conforming to the EMV standard. The communications protocol for the EMV contactless standard is thus mainly based on the protocol described in the ISO/IEC 14443 standard.

When information is transmitted between a reader and an object emulated in tag or card mode, the reader generates a magnetic field by means of its antenna which is generally, in the standards conventionally used, a sinusoidal wave at 13.56 MHz having an amplitude in the range between 0.5 and 7.5 amps/meter.

On the other side, the antenna of the object emulating the tag modulates the field generated by the reader.

This modulation is carried out by modifying the load connected to the terminals of the antenna of the object.

By modifying the load across the terminals of the antenna of the object, the output impedance of the antenna of the reader changes owing to the magnetic coupling between the two antennae. This results in a change in the amplitudes of the voltages and currents present on the antennae of the reader and of the object. Accordingly, in this way, the information to be transmitted from the object to the reader is transmitted by load modulation to the antenna current of the reader. A copy of this current is generated and injected into the receiver chain of the reader where it is demodulated and processed in such a manner as to extract the information transmitted.

However, such a load modulation has certain drawbacks.

Indeed, the variation in load carried out during the load modulation results in a modulation in amplitude and phase of the signal (voltage or current) on the antenna of the reader.

The frequency spectrum of this signal comprises a main spectral line, centered for example at 13.56 MHz, which corresponds to the carrier (13.56 MHz), and two side lines corresponding to the useful signal containing the information transmitted by the object.

However, it turns out that the characteristics of these side lines present on the antenna of the reader can vary depending on the antenna designs and on the matching of their network, and on the position of the object relative to the reader.

The current readers only contain an amplitude demodulator for demodulating the signal (voltage) on the terminals of the antenna. For this reason, only the information on amplitude of the side lines is detected but not the phase rotation of the latter. However, in some situations, in other words when the phase modulation is preponderant with respect to the amplitude modulation, the rotation of the side lines may be close to around 90° then leading to levels of these side lines close to 0. So, in this case, the amplitude demodulator of the reader cannot detect the signals contained in these lines whose levels fall below its detection threshold (sensitivity threshold).

The result of this is then that such reader/object pairs cannot meet standards that require a correct functionality within a certain operating volume as is the case for the EMVCo standard. Indeed, there is a loss of communication in certain positions of the operating volume defined in these standards.

Quite clearly, by changing the position of the object in the operating volume with respect to the reader, the level of the amplitude modulation may then be increased with respect to that of the phase modulation so as to reestablish the communication. However, this is not a satisfactory solution.

Another solution would consist in incorporating into the reader not only an amplitude demodulator but also a phase demodulator. Unfortunately, such a modification is not possible in the current readers which contain only an amplitude demodulator.

SUMMARY

Various embodiments of the invention relate to wireless communications between a reader and an object, for example, a transponder of the tag type, a contactless smartcard or else a mobile telephone emulated in card mode, without these examples being limiting, and more particularly the management and the correction of the load modulation carried out within such an object, in particular an NFC (Near Field Communications) object.

According to one embodiment, the idea is to add within the object a functionality that guarantees that the level of the amplitude modulation of the signal received at the antenna of the reader is always higher than the sensitivity threshold of the amplitude demodulator of the reader. Moreover, such a solution is not only compatible with the current readers but also with future readers which will furthermore be able to incorporate a phase demodulator.

According to one embodiment, the idea is to implement such a functionality so as to be compatible with all the object structures and all the wireless communications standards, for example NFC technology using the protocol described in the ISO/IEC 14443 standard but also the ISO/IEC 15693 and ISO/IEC 18000 standards.

According to one embodiment, the idea is also to implement this functionality in a particularly simple manner with an extra cost in terms of silicon bulk that is industrially acceptable.

According to one aspect, a method is provided for managing the operation of an object capable of contactless communication with a reader magnetically coupled to the object, comprising at least one transmission phase of information from the object to the reader comprising a modulation of the impedance of a load connected across the terminals of the antenna of the object.

According to a general feature of this aspect, the method furthermore comprises, prior to the at least one transmission phase, a monitoring phase comprising a monitoring of the level of amplitude modulation of a modulated test signal present at the antenna of the object and resulting from a test modulation of the impedance of the load, and a capacitive modification of the impedance of the load if this level is lower than a threshold.

This capacitive modification advantageously comprises the addition of a capacitance to the load.

The threshold advantageously corresponds to a sensitivity threshold of an amplitude demodulator of the reader.

Thus, if the level of amplitude modulation of the modulated test signal present at the antenna of the object is higher than the threshold, this means that the level of modulation of the signal present on the antenna of the reader is above the sensitivity threshold of the amplitude demodulator. The impedance of the load connected to the terminals of the antenna of the object does not then need to be modified.

On the other hand, in the opposite case, this means that the level of modulation of the signal received by the antenna of the reader falls below the sensitivity threshold of the demodulator of the reader and that the major part of load modulation energy has been translated into a phase modulation instead of an amplitude modulation. Then, in this case, the capacitive modification of the impedance of the load, which corresponds for example to a connection of at least one capacitor across the terminals of the antenna of the object, "ideally" allows a phase rotation of 90° to be injected into the side lines so as to render preponderant the modulation amplitude with respect to the phase amplitude and, as a consequence, the levels of the side lines to be increased in such a manner that the amplitude modulation of the signal received by the antenna of the reader can be demodulated by the amplitude demodulator of the reader.

One particularly simple way to carry out the monitoring of the level of modulation of the amplitude of the modulated test signal can comprise a determination of the envelope of this test signal, a determination of the amplitude between the peaks and the troughs of this envelope and a comparison of this amplitude with the threshold.

According to one embodiment, the test modulation comprises the generation of a test modulation signal, for example a succession of low and high logic states, configured for successively modifying the impedance in such a manner that it alternately takes two different values.

In practice, the load can comprise a first resistor connected in parallel across the terminals of the antenna, a second resistor connected in parallel across the terminals of the antenna via a switch controlled by the test modulation signal, the test modulation signal taking, successively and alternately, a low level and a high level so as to successively and alternately electrically connect, or otherwise, the second resistor to the terminals of the antenna.

The method can comprise several successive phases for transmission of information between the object and the reader. If, after the first transmission phase, the position of the object with respect to the reader does not vary, it would in theory be pointless to carry out a new monitoring phase prior to any new phase for transmission of information. However, in practice, when several phases are provided for transmission of information, it is preferable to carry out a monitoring phase prior to each transmission phase.

According to another aspect, a device is provided for managing the operation of an object capable of contactless communication with a reader magnetically coupled to the object, comprising a modulator configured for carrying out a modulation of the impedance of a load connected across the terminals of the antenna during a phase for transmission of information from the object to the reader.

According to a general feature of this other aspect, the device furthermore comprises a monitor configured for carrying out a monitoring phase, prior to the transmission phase, comprising a test modulation of the impedance of the load, a monitoring of the level of amplitude modulation of a modulated test signal present at the antenna of the object and resulting from the test modulation and a capacitive modification of the impedance of the load if this level is lower than a threshold.

According to one embodiment, the monitor comprises a processor configured for determining the envelope of this test signal and the amplitude between the peaks and the troughs of this envelope and a comparator configured for carrying out a comparison of this amplitude with the threshold.

According to one embodiment, the monitor comprises a tester configured for carrying out the test modulation and comprising a generator of a test modulation signal designed to successively modify the impedance in such a manner that it alternately takes two different values.

According to one embodiment, the load comprises a first resistor connected in parallel across the terminals of the antenna, and the tester comprises a second resistor connected in parallel across the terminals of the antenna via a switch controlled by the test modulation signal, the test modulation signal taking, successively and alternately, a low level and a high level so as to successively and alternately electrically connect, or otherwise, the second resistor to the terminals of the antenna.

According to one embodiment, the monitor comprises a capacitor connected to the terminals of the antenna via an auxiliary switch controlled by the output signal of the comparator.

The device such as defined hereinbefore may advantageously be implemented in an integrated manner.

According to another aspect, an object is provided, for example a smartcard, a tag, a cellular mobile telephone able to be emulated in card mode, incorporating a device such as defined hereinbefore.

BRIEF DESCRIPTION OF THE DRAWINGS

For a more complete understanding of the present invention, and the advantages thereof, reference is now made to the following descriptions taken in conjunction with the accompanying drawings, in which: Other advantages and features of the invention will become apparent upon examining the detailed description of non-limiting embodiments and the appended drawings in which:

FIGS. 1 to 7 illustrate schematically some embodiments of the invention.

DETAILED DESCRIPTION OF ILLUSTRATIVE EMBODIMENTS

In FIG. 1, the reference 1 denotes a reader, for example but not limited to, a cellular mobile telephone emulated in reader mode or else a conventional contactless smartcard or tag reader such as a badge, comprising an antenna 10 together with an amplitude demodulator 11 configured for carrying out an amplitude demodulation of a signal able to be amplitude modulated and received at the antenna 10, for example the voltage across the terminals of this antenna.

The reference 2 denotes an object, for example a cellular mobile telephone emulated in card mode, and more generally, an electromagnetic transponder such as a tag or a badge.

This object 2 here comprises an integrated circuit 20 also having an antenna 200 magnetically coupled to the reader 1 by a magnetic field irradiated by the reader 1.

In FIG. 2, it can be seen that the integrated circuit comprises, with the coil 200, a capacitor 201 forming with this coil a parallel resonant circuit for modulating the magnetic field generated by an oscillating circuit of the reader. This resonant circuit 200-201 is connected to the two AC inputs of a diode rectifier bridge 203. As a variant, it would be possible to use as rectifier element a single-alternation rectifier element.

When the transponder enters into the magnetic field of the reader, a high-frequency voltage is generated across the terminals of the resonant circuit 200-201. This voltage, rectified by the bridge rectifier 203, provides a power supply voltage for the electronic circuit 205 of the transponder, via a voltage regulator 204. The electronic circuit 205, more often than not incorporating the regulator 204, can contain at least a memory and a processor.

In order to enable the transmission of data from the transponder to the reader 1, the circuit 205 sends a command to a stage 202 for feedback-modulation of the resonant circuit 200-201. This stage 202 comprises at least one electronic switch, controlled by a signal SM delivered by the circuit 205, and at least one resistor so as to modify the load connected across the terminals of the antenna 200 and allow the detection by the reader.

The integrated circuit 20 also comprises a monitor 206 controllable by a control signal SCTRL delivered by the circuit 205. The monitor 206 is configured for carrying out, prior to a data transmission phase, a monitoring phase comprising a test modulation of the impedance of the load connected across the terminals of the antenna, and a monitoring of the level of amplitude modulation of a modulated test signal STM present at the antenna of the object and resulting from the test modulation and a capacitive modification of the impedance of the load if this level is lower than a threshold.

For this purpose, as will be seen in more detail hereinafter, the monitor 206 generates a test modulation signal SMT.

As illustrated in FIG. 3, the monitoring phase S30 is carried out just before the data transmission phase S31 comprising the load modulation. In practice, if there exist several successive transmission phases, a monitoring phase S30 will be carried out prior to each transmission phase S31.

As illustrated in FIG. 4, the monitoring phase S30 comprises a test modulation S300 carried out on the load connected to the terminals of the antenna 200 using the test modulation signal SMT so as to obtain at the antenna 200 a modulated test signal STM, for example the voltage across the terminals of the coil 200.

Subsequently (step S301), the level of amplitude modulation of the modulated test signal STM is determined.

Then, in a step S302, this level is compared with a threshold VTH chosen as a function of the sensitivity threshold of the demodulator 11 of the reader.

It is recalled here, as illustrated schematically in FIG. 5 which illustrates schematically the frequency spectrum of the signal (voltage) across the terminals of the antenna of the reader, that the useful signal containing the transmitted information is situated in the side lines BLB and BLS frequentially offset from the central line BP centered on the carrier frequency, for example 13.56 MHz.

If the level of the modulated test signal is higher than the threshold VTH, then this means that there is a sufficient amplitude modulation on the antenna 200 of the object and, as a consequence, sufficient amplitude modulation on the signal received by the antenna 10 of the reader which will allow the demodulator 11 of the reader to be able to correctly demodulate the signal for detecting the information.

If the level of amplitude modulation of the modulated test signal STM is lower than the threshold VTH, this then means that the phase amplitude of the signal present at the antenna 200 of the object is preponderant with respect to the amplitude modulation, which will result in a level of amplitude modulation of the signal present at the antenna 10 of the reader that is insufficient to allow demodulation of the signal and, as a consequence, detection of the information transmitted.

In this case, a capacitive modification of the load impedance is carried out (step S303) in such a manner as to (ideally) apply a phase rotation of 90° to the frequency side lines BLB and BLS of the signal received by the antenna 10 of the object.

In practice, as illustrated in FIG. 6, the determination of the amplitude level of the modulated test signal STM can comprise a determination S3010 of the envelope of the signal STM then a determination S3011 of the peaks and troughs of this envelope and, finally, a determination of the difference between the peaks and the troughs (step S3012).

This difference is representative of the level of amplitude modulation of the modulated test signal STM.

In practice, as illustrated schematically in FIG. 7, the monitor 206 comprises a processor comprising a block 2001 configured for determining the envelope of the modulated test signal STM, here the envelope of the voltage across the terminals of the resonant circuit 200-201, a block 2002 configured for determining the peaks of this envelope and a block 2003 configured for determining the troughs of this envelope.

The processor also comprises, at the output of the blocks 2002 and 2003, a block 2004 configured for effecting the difference between the level of the peaks and the level of the troughs so as to determine the amplitude between the peaks and the troughs of this envelope. The blocks 2001, 2002, 2003 and 2004 are blocks known per se and of conventional structure.

The output of the block 2004 is therefore representative of the level of amplitude modulation of the signal STM.

The monitor 206 further comprises a comparator 2005 for comparing this level with the threshold VTH so as to deliver a comparison signal SCMP which can take a high logic state or a low logic state depending on the comparison.

In this exemplary embodiment, the stage 202 for feedback-modulation further comprises a first resistor R1 connected to the terminals of the resonant circuit 200-201 and a second resistor R2 connected to the terminals of the resonant circuit via a switch SW2.

In a transmission phase, this switch SW2 is controlled by the modulation signal SM delivered by the processor 205 so as to be able to transmit the data to the reader.

On the other hand, in the monitoring phase, this switch SW2 is controlled by the test modulation signal SMT delivered by a generator 2007 and here comprising a succession of logic "0"s and "1"s so as to successively and alternately open and close the switch SW2.

The stage 202 for feedback-modulation further comprises at least one capacitor CX connected to the terminals of the antenna 200 via a switch SWX controlled by the comparison signal SCMP.

More precisely, if the comparison signal SCMP is equal to 0, the switch SWX is open and the capacitor CX is not electrically connected to the terminals of the antenna.

If the signal SCMP is in the logic state "1", the switch SWX is then closed electrically connecting the capacitor CX to the terminals of the antenna 200.

If the level of amplitude modulation of the signal STM is higher than the threshold VTH, then the signal SCMP takes the logic state "0", whereas if the level of amplitude modulation of the signal STM is lower than the threshold VTH, the signal SCMP takes the logic state "1".

The monitor 206 also comprises a monitoring block 2006 receiving the control signal SCTRL coming from the processor 205 and capable of activating, upon a command, all of the elements of the monitor 206 so as to effectively trigger the monitoring phase prior to the data transmission phase.

The value of the threshold VTH and the value of the capacitor CX may be determined by simulation.

More precisely, the value of the threshold VTH is linked to the transmission standard used.

It is, for example, assumed that the transmission has to satisfy the EMVCo standard.

According to this standard, on a probe of the reader called J2 and at a certain position of the object (card for example) with respect to the reader, the reader must receive a minimum level Vpp of signal resulting from the load modulation.

Those skilled in the art will for example be able to refer, at their convenience, notably to page 32 of the book entitled EMV Contactless Specifications for Payment Systems, EMV Contactless Communication Protocol Specification, version 2.0.1, July 2009, which shows a figure illustrating the signal J2 of the reader with the definition of Vpp, and also to the table A3 (page 134) in this same book for finding the various values of Vpp for various positions (z, r) of the card.

Furthermore, by simulation, those skilled in the art will be able to determine the value of the threshold VTH which guarantees that the signal received by the reader has a higher level than Vpp.

With regard to the capacitance of the capacitor CX, this depends on the circuit layout of the object, and, by simulation, those skilled in the art will be able to determine the capacitance of CX needed to rotate the phase of the side bands by around 90°. The phase of these side bands may for example be determined by simulation by finding the Fourier transform of the signal J2.

In other words, the value of VTH and the capacitance of CX may be evaluated by simulating the circuit of the object coupled to the reader, and the difficulties of detection of the object always occur when the object is too far from the reader. Accordingly, the value of VTH and the capacitance of CX will be determined at limiting positions of the object (for example for z greater than 2 and r equal to 2.5 in the aforementioned table A3). Various simulated values for VTH and CX are then obtained and it is then for example possible to choose the average of these values as values effectively implemented for VTH and CX.

What is claimed is:

1. A device for managing operation of an object capable of contactless communication with a reader magnetically coupled to the object, the device comprising:
    a modulator configured to modulate an impedance of a load connected across terminals of an antenna of the object during a transmission phase during which information is transmitted from the object to the reader; and
    a monitor configured to carry out a monitoring phase, prior to the transmission phase, the monitoring phase comprising
      a test modulation of the impedance of the load,
      a monitoring of a level of amplitude modulation of a modulated test signal present at the antenna of the object and resulting from the test modulation, and
      a capacitive modification of the impedance of the load comprising shifting a phase of sidebands of the modulated test signal if the level is lower than a threshold.

2. The device according to claim 1, wherein the threshold corresponds to a sensitivity threshold of an amplitude demodulator of the reader.

3. The device according to claim 1, wherein the monitor comprises:
    a processor configured to determine an envelope of the modulated test signal and an amplitude between peaks and troughs of the envelope; and
    a comparator with a first input coupled to receive the amplitude and a second input coupled to receive the threshold.

4. The device according to claim 3, wherein the monitor comprises a capacitor connected to the terminals of the antenna via an auxiliary switch controlled by an output signal of the comparator.

5. The device according to claim 4, wherein the capacitor is configured to modify the impedance of the load by shifting the phase of the sidebands of the modulated test signal by about 90 degrees when the level of amplitude modulation is lower than the threshold.

6. The device according to claim 1, wherein the monitor comprises a tester configured to carry out the test modulation, the tester comprising a generator of the test modulation signal designed to successively modify the impedance in such a manner that it alternately takes two different values.

7. The device according to claim 6, wherein the load comprises a first resistor connected across the terminals of the antenna, and the tester comprises a second resistor connected across the terminals of the antenna via a switch controlled by the test modulation signal, the test modulation signal successively and alternately taking a low level and a high level so as to successively and alternately electrically connect, or otherwise, the second resistor to the terminals of the antenna.

8. An object capable of contactless communication with a reader magnetically coupled to the object, the object comprising:
 an antenna comprising first and second terminals;
 a modulator coupled between the first and second terminals of the antenna, the modulator configured to modulate an impedance of a load connected across the first and second terminals during a transmission phase during which information is contactlessly transmitted from the object to the reader;
 a processor configured to determine an envelope of a test signal and an amplitude between peaks and troughs of the envelope;
 a comparator with a first input coupled to receive the amplitude and a second input coupled to receive a threshold; and
 a capacitor connected to the first and second terminals of the antenna via an auxiliary switch controlled by an output signal of the comparator, the capacitor configured to modify the impedance of the load by shifting a phase of sidebands of the test signal.

9. The object according to claim 8, wherein the load comprises a first resistor connected across the first and second terminals of the antenna, the object further comprising a second resistor connected across the first and second terminals of the antenna via a second switch.

10. The object according to claim 8, further comprising a generator of a test modulation signal that is designed to successively modify the impedance in such a manner that it alternately takes two different values.

11. The object according to claim 10, wherein the load comprises a first resistor connected across the first and second terminals of the antenna, the object further comprising a second resistor connected across the first and second terminals of the antenna via a second switch controlled by the test modulation signal, the test modulation signal successively and alternately taking a low level and a high level so as to successively and alternately electrically connect, or otherwise, the second resistor to the first and second terminals of the antenna.

12. The object according to claim 8, wherein the capacitor is configured to modify the impedance of the load by shifting the phase of the sidebands of the test signal by about 90 degrees when the amplitude is lower than the threshold.

13. The object according to claim 8, wherein the threshold corresponds to a sensitivity threshold of an amplitude demodulator of the reader.

14. An object capable of contactless communication with a reader magnetically coupled to the object, the object comprising:
 an antenna comprising first and second terminals;
 a modulator coupled between the first and second terminals of the antenna, the modulator configured to modulate an impedance of a load connected across the first and second terminals during a transmission phase during which information is contactlessly transmitted from the object to the reader;
 a processor configured to
  determine an envelope of a modulated test signal comprising sidebands offset in frequency from a carrier frequency, and
  determine an amplitude difference between peaks of the envelope and troughs of the envelope;
 a comparator configured to
  compare the amplitude difference received at a first input of the comparator with a threshold received at a second input of the comparator, and
  send an output signal to an auxiliary switch; and
 a capacitor connected to the first and second terminals of the antenna via the auxiliary switch controlled by the output signal of the comparator, wherein the capacitor is configured to modify the impedance of the load by shifting a phase of the sidebands of the modulated test signal by about 90 degrees when the amplitude difference is lower than the threshold.

15. The object according to claim 14, wherein the threshold corresponds to a sensitivity threshold of an amplitude demodulator of the reader.

16. The object according to claim 14, further comprising:
 a signal generator configured to generate a test signal designed to successively modify the impedance in such a manner that it alternately takes two different values.

17. The object according to claim 16, further comprising:
 a resistor connected across the first and second terminals of the antenna via a second switch, wherein
  during a monitoring phase performed prior to the transmission phase, the second switch is controlled by the test signal, and
  during the transmission phase, the second switch is controlled by a modulation signal comprising data transmitted to the reader.

18. The object according to claim 16, further comprising:
 a tester comprising a resistor connected across the first and second terminals of the antenna via a second switch controlled by the test modulation signal, the test modulation signal alternately taking the two different values comprising a low level and a high level so as to alternately electrically connect the resistor to the first and second terminals of the antenna.

19. The object according to claim 14, wherein the load comprises a resistor connected across the first and second terminals of the antenna.

20. The object according to claim 14, wherein the object is a cellular mobile telephone emulated in card mode.

* * * * *